(12) United States Patent
Schmitz et al.

(10) Patent No.: US 6,316,342 B1
(45) Date of Patent: Nov. 13, 2001

(54) LOW TURN-ON VOLTAGE INDIUM PHOSPHIDE SCHOTTKY DEVICE AND METHOD

(75) Inventors: Adele E. Schmitz; Robert H. Walden, both of Newbury Park; Mark Lui, Los Angeles; Mark K. Yu, Thousand Oaks, all of CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/640,458

(22) Filed: Aug. 15, 2000

Related U.S. Application Data

(62) Division of application No. 09/322,260, filed on May 28, 1999.

(51) Int. Cl.[7] .................. H01L 21/00; H01L 21/338; H01L 21/425; H01L 21/28; H01L 21/44
(52) U.S. Cl. ............ 438/573; 438/92; 438/167; 438/534
(58) Field of Search .......... 438/570, 92, 167, 438/534, 573; 257/18, 191

(56) References Cited

U.S. PATENT DOCUMENTS

| | | |
|---|---|---|
| 4,471,367 | 9/1984 | Chen et al. . |
| 4,954,851 | 9/1990 | Chan . |
| 5,198,682 | 3/1993 | Wu et al. . |
| 5,365,077 | 11/1994 | Metzger et al. . |
| 5,489,549 * | 2/1996 | Hasenberg et al. .................. 437/133 |
| 5,512,776 | 4/1996 | Bayraktaroglu . |
| 5,532,486 | 7/1996 | Stanchina et al. . |
| 5,572,043 | 11/1996 | Shimizu et al. . |
| 5,652,435 | 7/1997 | Martin et al. . |
| 5,665,999 | 9/1997 | Brugger . |
| 5,789,760 | 8/1998 | Irikawa et al. . |
| 5,856,685 * | 1/1999 | Nakayama ............................ 257/192 |
| 5,920,773 * | 7/1999 | Hafizi et al. .......................... 438/170 |
| 6,144,049 * | 11/2000 | Onda ..................................... 257/194 |

OTHER PUBLICATIONS

Fritz et al., Strained–Layer–Superlattice Technology for Vertical–Cavity Optoelectronic Modulators at Near–Infrared Wavelengths, Feb. 1994, IEEE Journal of Quantum Electronics, vol. 30, No. 2, pp. 452–458.*

Hong, et al., "Optimization of MOVPE Grown $In_xAl_{1-x}As/In_{0.53}Ga_{0.47}As$ Planar Heteroepitaxial Schottky Diodes For Terahertz Applications", *IEEE Transactions on Electron Devices,* IEEE Inc., New York, vol. 41, No. 9, Sep. 1, 1994; pp. 1489–1497.

Lee et al. "High Quality $In_{0.53}Ga_{0.47}As$ Schottsky diode formed by graded superlattice of $In_{0.53}Ga_{0.47}As/In_{0.52}Al_{0.48}As$" *Appl. Phys. Lett. 54* vol. 19 May 8, 1989 pp. 1863–1865.

Lin et al. "Composition dependence of $Au/In_xAl_{1-x}As$ Schottky barrier heights" *Appl. Phys. Letter 49.* vol. 23 Dec. 8, 1986 pp. 1593–1595.

* cited by examiner

*Primary Examiner*—Vu A. Le
*Assistant Examiner*—Adam Pyonin
(74) *Attorney, Agent, or Firm*—Ladas & Parry

(57) ABSTRACT

A Schottky diode, and a method of making the same, which is fabricated on InP material and employs a Schottky layer including $In_xAl_{1-x}AS$ with x>0.6, or else including a chirped graded superlattice in which successive periods of the superlattice contain progressively less GaInAs and progressively more AlInAs, the increase in AlInAs being terminated before the proportion of AlInAs within the last period (adjacent the anode metal) exceeds 80%. Such fabrication creates an InP-based Schottky diode having a low turn-on voltage which may be predictably set within a range by adjusting the fabrication parameters

23 Claims, 4 Drawing Sheets

LOW TURN-ON VOLTAGE INDIUM PHOSPHIDE SCHOTTKY DEVICE AND METHOD

This is a divisional of co-pending application Ser. No. 09/322,260 filed on May 28, 1999.

This invention was made with government support under Contract No. 97-F156500-00 awarded by the Defense Advanced Research Projects Agency (DARPA). The government has certain rights in this invention.

FIELD OF THE INVENTION

The present invention pertains to Schottky diodes, and more particularly to Schottky diodes fabricated using InP semiconductor material.

BACKGROUND

Schottky diodes are well-known in GaAs and Si technologies. Some Si-based Schottky diodes have fairly low turn-on voltages but suffer from high series resistance and relatively poor frequency response. Si-based Schottky diodes are not easily integrated into InP-based semiconductor fabrication.

Low turn-on voltages are often desirable for Schottky diodes, particularly for mixer applications. U.S. Pat. No. 5,665,999 issued Sep. 9, 1997 to H. Brugger, teaches that low turn-on voltage Schottky diodes permit a low conversion loss without requiring a high pumping capacity in the local oscillator, and without using a bias voltage which may lead to Townsend current-hum disturbances. A GaAs Schottky device with reduced turn-on voltage is taught as fabricated using a graded $In_xGa_{(1-x)}As$ layer over a GaAs substrate, where the In content, x, increases continuously in the direction of the metal contact. Compatibility with InP is not taught, and the spatially varying lattice mismatch created by this process is thought potentially unreliable with InP technologies.

Schottky diodes compatible with InP semiconductor technology are known. For example, U.S. Pat. No. 5,652,435, issued Jul. 29, 1997 to E. Martin et al., describes a Schottky diode optical detector wherein the light-sensitive InGaAs layer is cladded front and back with InAlAs current-blocking layers. This device has a relatively high turn-on voltage similar to that of conventional GaAs Schottky diodes.

Some investigation into the relationship between Schottky barrier height and the proportion of In in $In_xAl_{1-x}As$ material on an InP substrate has been undertaken by C. L. Lin, et al. in "Composition dependence of $Au/In_xAl_{1-x}As$ Schottky barrier heights," *Applied Physics Letters* 49 (23), Dec. 8, 1986, pp. 1593–1595. Lin performs tests on the noted compound for $0.45 \leq x \leq 0.55$, a range producing relatively high Schottky barriers.

InP-compatible Schottky diodes using a graded superlattice Schottky layer are also known. For example, U.S. Pat. No. 5,198,682 issued Mar. 30, 1993 to C.-S. Wu et al. describes an infrared photodetector using a superlattice having a graded dopant concentration, thereby developing an internal field which aids in the collection of photoexcited carriers. Lee et al., in Appl. Phys. Lett. Vol. 54, May 1989, pp. 1863–1865, teaches use of a graded superlattice of InGaAs/InAlAs to obtain enhanced Schottky barrier height U.S. Pat. No. 5,572,043, issued Nov. 5, 1996 to Shimizu et al. describes another SL-based Schottky diode, using sublayers of variously lattice-mismatched compounds and alternating compressively and tensilely strained layers to balance the mismatches. Each of these three references describe Schottky diodes having a relatively high turn-on voltage of ~0.6V–0.7V.

InP-compatible Schottky diodes having high turn-on voltages are known. For example, U.S. Pat. No. 4,471,367 issued Sep. 11, 1984 to C. Chen et al. discloses a MESFET-gate Schottky structure composed of a thin, heavily doped InGaAs layer overlying a layer of low-doped InGaAs having an increased barrier height. Another example is U.S. Pat. No. 4,954,851, issued Sep. 4, 1990 to W. Chan, which describes a Schottky diode with a cadmiumcontaining layer overlying an InAlAs layer. The Cd-containing layer enhances the barrier height of the diode.

Thus, Schottky diodes with reduced turn-on voltages exist but are not known to be compatible with InP-based fabrication techniques. Schottky diodes compatible with InP are known, but all have conventional or high tun-on voltages. Yet, InP-based fabrication technologies are desirable, and low turn-on voltage Schottky diodes are particularly useful in certain applications, such as high-frequency mixers. A need therefore exists for low turn-on voltage Schottky diodes, and a method of making the same, which are compatible with InP fabrication technologies.

SUMMARY OF THE INVENTION

The present invention addresses the need for low turn-on voltage Schottky diodes compatible with InP-based fabrication by employing an InP lattice-compatible Schottky layer which interfaces with the Schottky metal layer and provides a relatively low Schottky barrier height resulting in a low turn-on voltage.

The Schottky metal layer is preferably Ti/Pt/Au. The Schottky layer is preferably grown over a low-doped GaInAs layer, which in turn is preferably grown over a highly doped GaInAs layer. The highly-doped GaInAs layer forms the Schottky cathode contact. The cathode contact is grown over a buffer layer, such as 2500 A of AlInAs or 100 A of undoped GaInAs, preferably grown directly on the InP substrate.

According to the present invention, the Schottky layer is processed to produce a low turn-on voltage.

At According to a first embodiment of the invention, the Schottky layer includes strained $Al_{(1-x)}In_xAs$, and for x=0.70 produces a turn-on voltage of 0.25V@1mA. The corresponding 0.3Al content is lower than that which lattice-matches InP, and accordingly the thickness of the layer is preferably around 100 Å to limit effects from the strain.

According to second, third and fourth embodiments of the invention, the Schottky layer includes a chirped superlattice composed of a plurality of periods, each period containing sublayers of $Ga_{0.47}In_{0.53}As$ and $Al_{0.48}In_{0.52}As$, which are lattice-matched to InP. The proportional thickness of the two compounds is varied from period to period to provide a step-wise, or chirped, grade in composition of the superlattice from GaInAs toward AlInAs. The turn-on voltage can be precisely controlled by truncating the grading steps before completing a transition to predominantly AlInAs.

Throughout this patent, GaInAs refers to $Ga_{0.47}In_{0.53}As$, and AlInAs refers to $Al_{0.48}In_{0.52}As$, unless a different composition is specified or required by the context.

DESCRIPTION OF THE PREFERRED EMBODIMENTS

Figure 1:
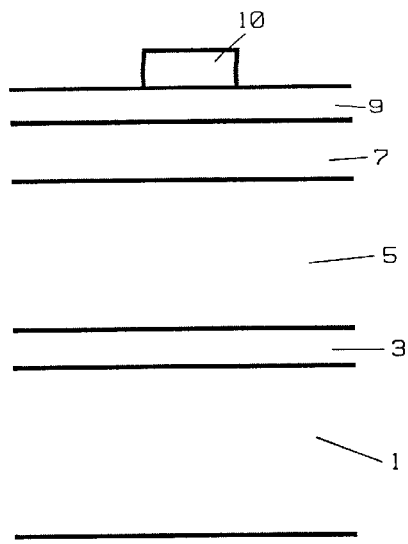
FIG. 1 is the layer structure of a diode according to the present invention after a first etch.
Figure 2:
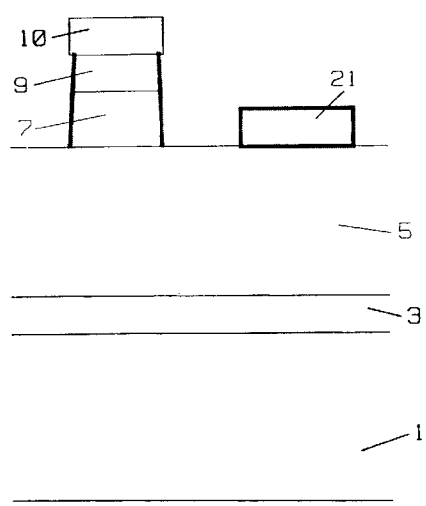
FIG. 2 shows the structure of the diode after a second etch step.

While discrete Schottky diodes can be made according to the present invention, the present invention is very well suited to integrated fabrication. Such fabrication, as shown in FIG. 1, preferably uses Molecular Beam Epitaxy (MBE) to grow each of the layers on InP substrate 1, though any other compatible process, such as Metal Organic Vapor Phase Epitaxy(MOVPE), may be used. Buffer layer 3 is grown directly on InP substrate 1 Buffer layer 3 is about 2500 Å of undoped AlInAs, or may alternatively be about 100 Å of undoped GaInAs. Cathode contact layer 5 is grown on the buffer layer, preferably highly doped, preferably with Si, to $n=1\times10^{19}$ cm$^{-3}$. Cathode contact layer 5 is preferably grown to about 3000 Å of GaInAs, the thickness helping to reduce bulk resistance of the cathode and also simplifing the later etch step down to cathode contact layer 5 which permits deposition of cathode contact 21 (FIG. 2). Depletion layer 7 is about 1000 Å of undoped GaInAs grown atop cathode contact layer, and helps to minimize the diode capacitance by increasing the depletion width of the diode.

Schottky layer 9 is grown next. In a first embodiment of the invention the Schottky layer is undoped, strained $Al_{1-x}In_xAs$, preferably $Al_{0.3}In_{0.7}As$. In this first embodiment, Schottky layer 9 is preferably grown to about 100 Å thick to reduce crystal anomalies due to the strain from the lattice mismatch. Schottky layer 9 is described further below in accordance with second, third and fourth alternative embodiments of the invention.

After Schottky layer 9, a cap layer of about 50 Å of undoped GaInAs (not shown) is grown to protect AlInAs in the Schottky layer from ambient oxygen. FIG. 1 shows the device after the first etch step has removed the cap, and Schottky metal layer 10 has been deposited by any standard technique. Schottky metal layer 10 is preferably about 250 Å Ti, 1000 Å Pt. and 6000 Å Au.

An etch step, preferably using Schottky metal 10 as an etch stop, mesa etches Schottky layer 9 and depletion layer 7 to expose cathode contact layer 5 as shown in FIG. 2. Due to the thickness of cathode contact layer 5, a timed wet etch may be used, or any compatible etch process. Next, cathode ohmic contact 21 is deposited on cathode contact layer 5, preferably with 900 Å AuGe, 100 Å Ni, and 2000 Å Au.

Figure 3:
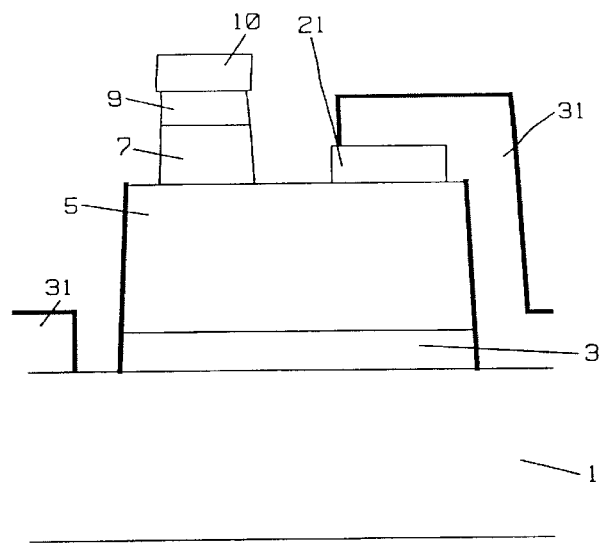
FIG. 3 shows the structure of the diode after a third etch step.

FIG. 3 shows the result of the next two steps. Cathode contact layer 5 and depletion layer 3 are both mesa-etched using any compatible etch technique, to isolate the diode structure on substrate 1 Thereafter, first level interconnect metal 31 is deposited, using any compatible metal, to provide means for connecting external circuits to the device.

Figure 4:
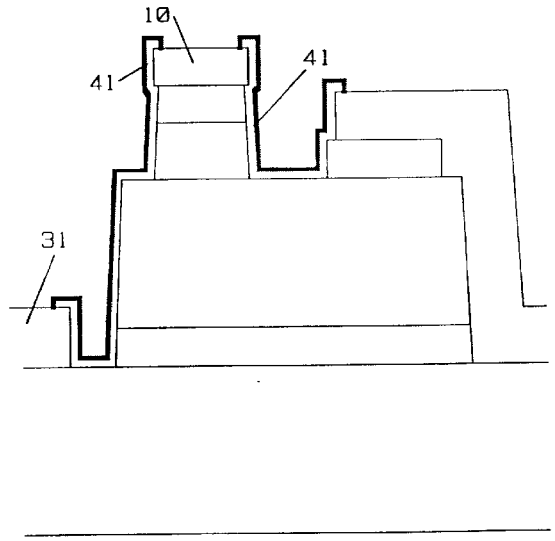
FIG. 4 shows the structure of the diode after passivation and etching of the passivation layer.

FIG. 4 shows the device after the step of adding passivation layer 41 of preferably silicon nitride, and after the subsequent step of etching passivation layer 41 to expose Schottky metal 10 and first layer metallization 31.

Figure 5:
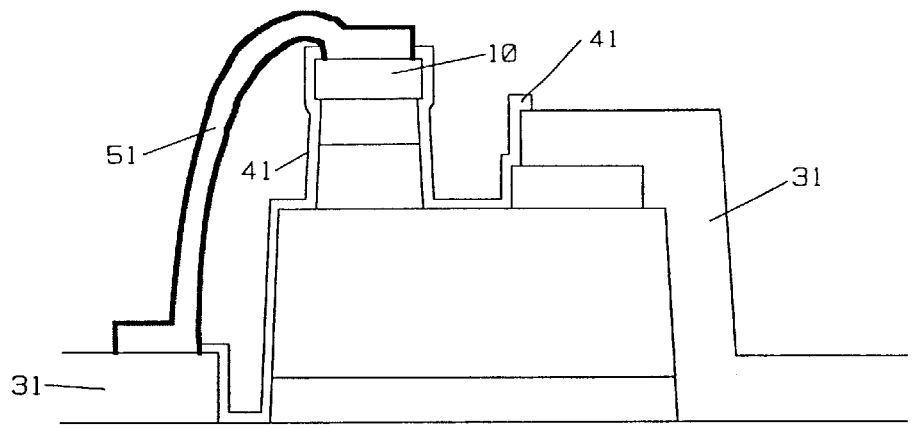
FIG. 5 shows the structure of the completed diode.

FIG. 5 shows airbridge 51 placed to connect Schottky anode metal 10 to first layer metallization 31. Airbridge 51 is preferred for high frequency applications, as it reduces diode capacitance. In many applications, the anode may be connected by other well-known metallization techniques.

Figure 6:
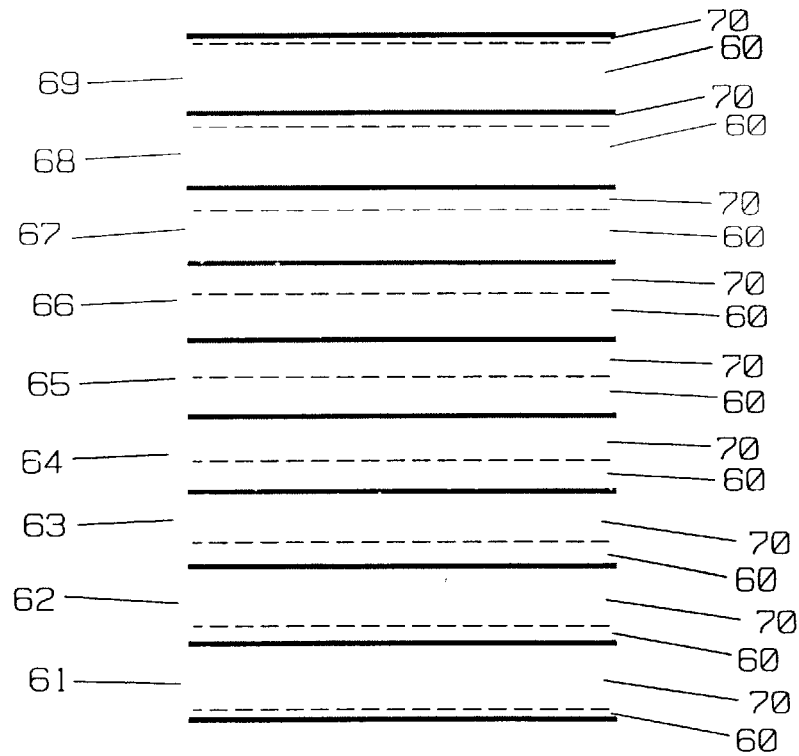
FIG. 6 depicts a chirped graded superlattice having nine periods.

FIG. 6 shows the layer structure of a superlattice composed of nine periods 61–69 which are each compound of first sublayer 60 and second sublayer 70. Such a superlattice may be used to grade a material in a stepwise or "chirped" fashion, from predominantly the material of second sublayer 70 in first period 61, to predominantly the material of first sublayer 60. Between successive periods, the thickness of first sublayer 60 is increased, while the thickness of second sublayer 70 is correspondingly decreased. For convenience, first sublayer 60 is about 10% of the thickness of first period 61 of a nine-period chirped graded superlattice, increasing linearly to 90% of the thickness of ninth period 69; while second sublayer 70 is about 90% of the thickness of first period 61, reducing to about 10% of the thickness of ninth period 69.

Figure 7:
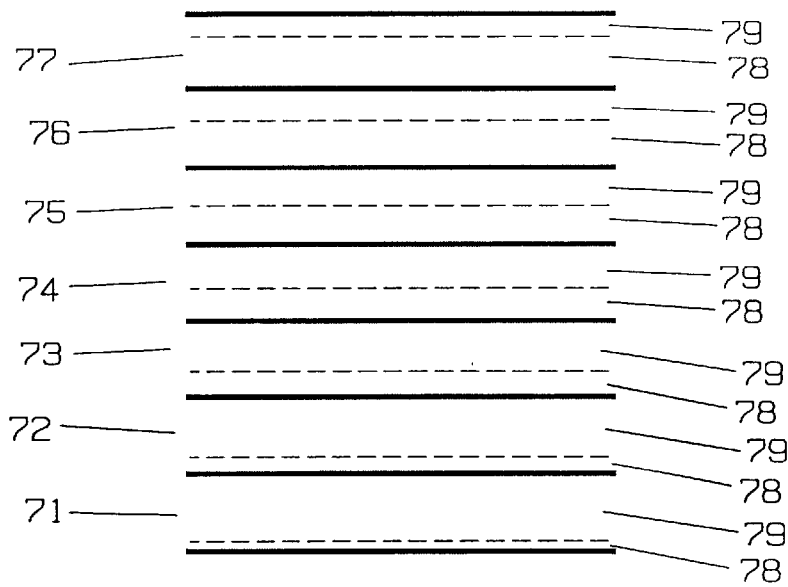
FIG. 7 depicts the Schottky layer structure for the second embodiment of the present invention.

FIG. 7 shows Schottky layer 9 according to a second embodiment of the present invention. For convenience, periods 71–77 are each about 33 Å thick. First sublayers 78 are AlIAs, and second sublayers 79 are GaInAs, both lattice-matched to InP. In first period 71, first sublayer 78 is about 3.3 Å thick; subsequent sublayers 78 increase by about 3.3 Å in each successive period so that in seventh period 77, first sublayer 78 is about 23.1 Å thick. Second sublayer 79 decreases by about 3.3 Å per period from about 29.7 Å in first period 71 to about 9.9 Å in seventh period 77. Thus, FIG. 7 shows a chirped graded superlattice based on a nine-period grading transition, but truncated at seven periods. A Schottky diode fabricated according to this embodiment results in a room-temperature turn-on voltage of about 0.37V at 1 mA. I–V curve 700 of FIG. 10 is for this embodiment of the invention.

Figure 8:
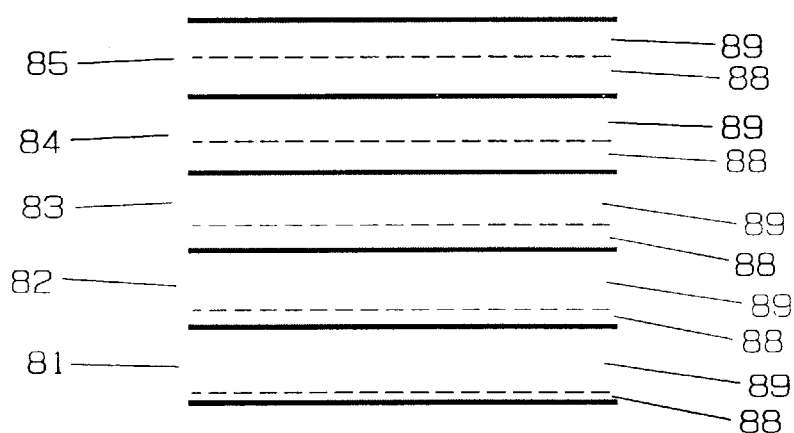
FIG. 8 depicts the Schottky layer structure for the third embodiment of the present invention.

FIG. 8 shows the layer structure of Schottky layer 9 according to a third embodiment of the present invention. This embodiment is also based on a nine-period superlattice grading arrangement, but is truncated at 5 layers instead of at 7. First sublayer 88 of first period 81 is about 3.3 Å of AlInAs, increasing by about 3.3 Å in successive periods 82, 83, 84 and 85 so that in fifth period 85 it is about 16.5 Å. Second sublayer 89 is GaInAs, and is about 29.7 Å in first period 81, decreasing to about 16.5 Å in fifth period 85. A Schottky diode fabricated according to this embodiment results in a room-temperature turn-on voltage of about 0.25V at 1 mA. I–V curve 800 of FIG. 10 is for this embodiment of the invention.

Figure 9:
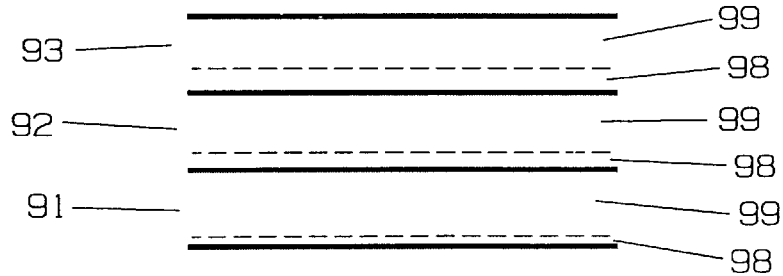
FIG. 9 depicts the Schottky layer structure for the fourth embodiment of the present invention.

FIG. 9 shows the layer structure of Schottky layer 9 according to a fourth embodiment of the present invention. This embodiment is also based on a nine-period superlattice grading arrangement, but is truncated at 3 layers instead of at 5 or 7. First sublayer 98 of first period 91 is about 3.3 Å of AlInAs, increasing by about 3.3 Å in successive periods 92 and 93 so that in third period 93 it is about 10 A. Second sublayer 99 is GaInAs, and is about 29.7 Å in first period 91, decreasing to about 23 Å in third period 93. A Schottky diode fabricated according to this embodiment results in a room-temperature turn-on voltage of about 0.15V at 1 mA. I–V curve 900 of FIG. 10 is for this embodiment of the invention.

Figure 10:
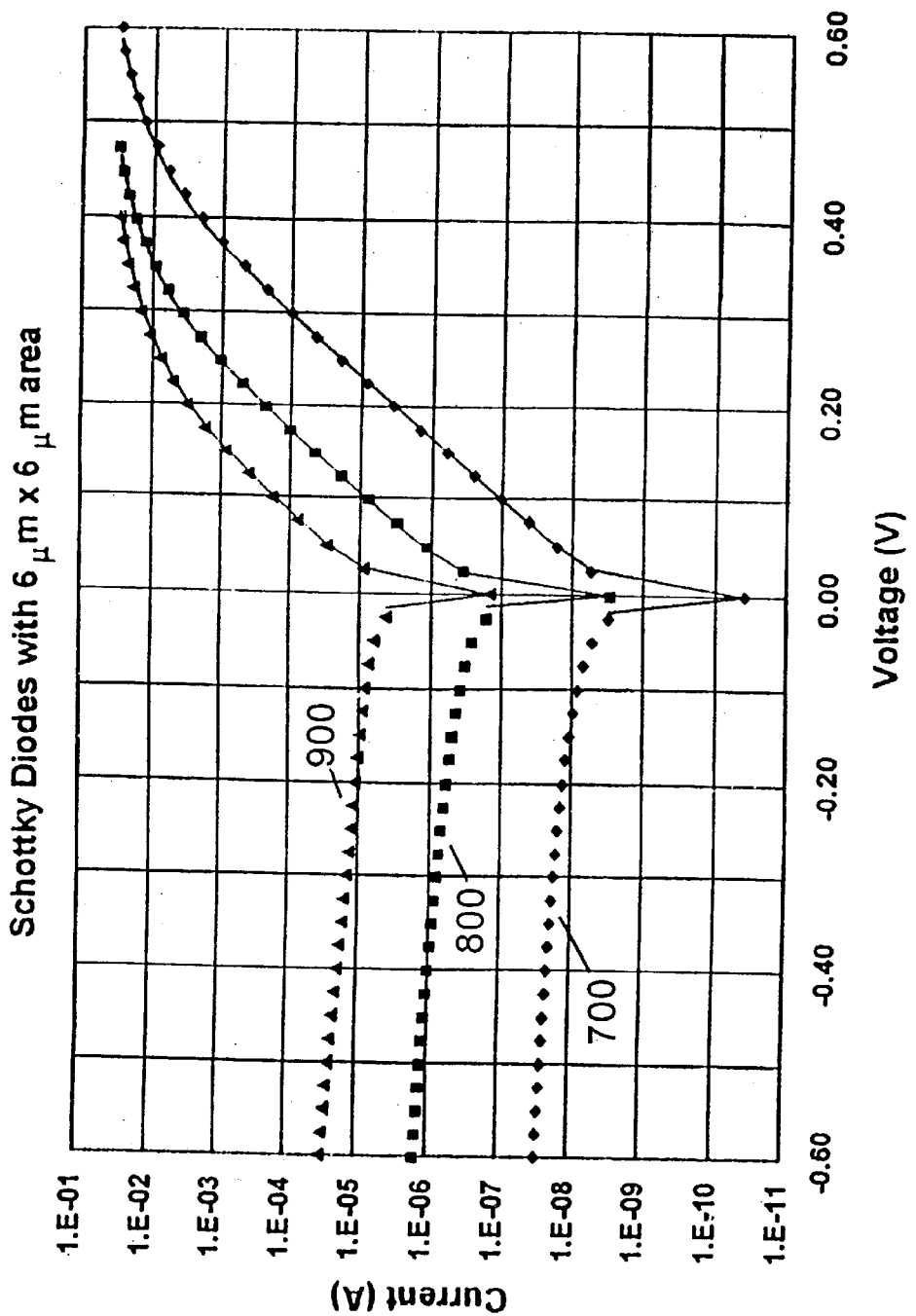
FIG. 10 shows I–V curves for three embodiments of the present invention.

FIG. 10 shows an I–V curve for each of three described embodiments. Curve 700 is the I–V curve for the embodiment of FIG. 7, curve 800 for the embodiment of FIG. 8 (below), and curve 900 for the embodiment of FIG. 9 (below).

For sufficiently thin periods, the effective bandgap tracks the average composition of the superlattice. Since the superlattice of the second, third and fourth embodiments of the invention is chirped, the Schottky barrier height changes discontinuously from period to period. Small chirped grading steps produce smaller Schottky barrier height discontinuities, and hence are thought to help reduce carrier pile-up which may occur on Schottky barrier height discontinuities. Since such pile-up may reduce speed, smaller grading steps may thus enhance speed. Accordingly, the present invention could be practiced with a superlattice truncated partway through a GaInAs to AlInAs grading arrangement which requires more than nine periods to complete, and correspondingly has smaller steps from period to period.

Embodiments of the present invention have been described which truncate a nine-period grading arrangement at three, five and seven periods. Truncating at different numbers of periods permits close control of the turn-on voltage of Schottky diodes fabricated according to the present invention. If truncation is based upon grading arrangements requiring more than nine periods to completion, the on-voltage step size between different truncation points is correspondingly reduced, enhancing the fineness of fabrication control of that parameter.

Periods of different, and indeed varying, thickness are within contemplation of the present invention. The composition of sublayers need not change in equal-sized steps between successive periods. Periods may have sublayers of alternative materials, and may have additional materials added.

Fabrication details are merely exemplary; the invention is defined by the following claims.

What is claimed is:

1. A method of making a Schottky diode comprising steps of:
   preparing an InP substrate;
   growing a doped cathode contact layer of GaInAs above the substrate;
   growing a semiconductor Schottky layer above the cathode contact layer, the Schottky layer being either:
   (a) a truncated chirped superlattice of GaInAs and AlnIAs, or
   (b) predominantly $In_xAl_{1-x}As$ with x greater than 0.6; and
   depositing a metal anode contact of the Schottky layer.

2. The method of claim 1 wherein the GaInAs and the AlInAs are respectively $Ga_{0.47}In_{0.53}As$ and $Al_{0.48}In_{0.52}As$ and thereby are lattice-matched to InP.

3. The method of claim 1 wherein the Schottky layer is a truncated chirped superlattice, and the step of growing the Schottky layer includes the steps of:
   growing a plurality of layer periods including a first layer period nearest the cathode contact layer and a last layer period nearest the metal anode contact, each layer period having a thickness, and each layer period including as constituents a first sublayer of AlInAs having a thickness and a second sublayer of GaInAs having a thickness, the AlInAs in each layer period being a proportion of a total of material composing that layer period;
   wherein the thicknesses of the first sublayers of each layer period are varied for successive layer periods and the thicknesses of the second sublayers of each layer period are varied for successive layer periods to stepwise change the proportion of AlInAs to the total material of successive layer periods, and truncating growth of further layer periods such that the proportion of AlInAs in the last layer period grown does not exceed 80% of the total material of the last layer period.

4. The method of claim 3 wherein
   the first sublayer of each layer period is grown with increasing thickness in each successive layer period; and
   the second sublayer of each layer period is grown with decreasing thickness in each successive layer period;
   such that the proportion of AlInAs increases stepwise for each successive layer period.

5. The method of claim 4 wherein the stepwise increase in the proportion of AlInAs is approximately uniform for each successive layer period.

6. The method of claim 5 wherein the proportion of AlInAs of the last layer period does not exceed 60% of the total material of the last layer period.

7. The method of claim 3 wherein the number of layer periods is five.

8. The method of claim 3 wherein the superlatice is composed of AlInAs lattice-matched to InP and GaInAs lattice-matched to InP, and the proportion of AlInAs of the last layer period is between 30% and 70% of the total material of the last layer period.

9. The method of claim 8 wherein the proportion of AlInAs in the last layer period is about 50% of the total material of the last layer period.

10. A method of making a Schottky diode having a turn on voltage of 0.37 V or less at 0.1 mA, the method comprising steps of:
    preparing an InP substrate;
    growing a doped cathode contact layer of GaInAs above the substrate;
    growing a semiconductor Schottky layer above the cathode contact layer, the Schottky layer comprising a truncated chirped superlattice of GaInAs and AlnIAs; and
    depositing a metal anode contact for the Schottky layer.

11. The method of claim 10 wherein the GaInAs and the AlInAs are respectively $Ga_{0.47}In_{0.53}As$ and $Al_{0.48}In_{0.52}As$ and thereby are lattice-matched to InP.

12. The method of claim 10 wherein the truncated chirped superlattice Schottky layer is grown by steps of:
    growing a plurality of layer periods including a first layer period nearest the cathode contact layer and a last layer period nearest the metal anode contact, each layer period having a thickness, and each layer period including as constituents a first sublayer of AlInAs having a thickness and a second sublayer of GaInAs having a thickness, the AlInAs in each layer period being a proportion of a total of material composing that layer period;
    wherein the thicknesses of the first sublayers of each layer period are varied for successive layer periods and the thicknesses of the second sublayers of each layer period are varied for successive layer periods to stepwise change the proportion of AlInAs to the total material of successive layer periods, and
    truncating growth of further layer periods such that the proportion of AlInAs in the last layer period grown does not exceed 80% of the total material of the last layer period.

13. The method of claim 12 wherein
the first sublayer of each layer period is grown with increasing thickness in each successive layer period; and
the second sublayer of each layer period is grown with decreasing thickness in each successive layer period;
such that the proportion of AlInAs increases stepwise for each successive layer period.

14. The method of claim 13 wherein the stepwise increase in the proportion of AlInAs is approximately uniform for each successive layer period.

15. The method of claim 14 wherein the proportion of AlInAs of the last layer period does not exceed 60% of the total material of the last layer period.

16. The method of claim 12 wherein the number of layer periods is five.

17. The method of claim 12 wherein the superlatice is composed of AlInAs lattice-matched to InP and GaInAs lattice-matched to InP, and the proportion of AlInAs of the last layer period is between 30% and 70% of the total material of the last layer period.

18. The method of claim 17 wherein the proportion of AlInAs in the last layer period is about 50% of the total material of the last layer period.

19. A method of making a Schottky diode having a turn on voltage of 0.37 V or less at 0.1 mA, the method comprising steps of:
preparing an InP substrate;
growing a doped cathode contact layer of GaInAs above the substrate;
growing a semiconductor Schottky layer above the cathode contact layer, the Schottky layer comprising predominantly $In_xAl_{1-x}As$ with x greater than 0.6; and
depositing a metal anode contact of the Schottky layer.

20. A method of tuning the turn on voltage of a Schottky diode, the Schottky diode including an InP substrate and doped cathode contact layer of GaInAs arranged adjacent the InP substrate, the method comprising the steps of:
growing a semiconductor Schottky layer adjacent the cathode contact layer, the Schottky layer comprising a chirped superlattice of GaInAs and AlnIAs based on an grading period of X periods, the chirped superlattice of GaInAs and AlnIAs being truncated so that the superlattice has a number of periods less than X, the number of periods being adjusted to tune the turn on voltage of the Sckottky diode to a desired voltage no greater than 0.37 V; and
depositing a metal anode contact for the Schottky layer.

21. The method of claim 20 wherein the GaInAs of the doped cathode contact and the GaInAs and the AlInAs of the Schottky layer are $Ga_{0.47}In_{0.53}As$ and $Al_{0.48}In_{0.52}As$ and thus are lattice-matched to InP.

22. The method of claim 21 further including an undoped buffer layer disposed between the InP substrate and the doped cathode contact layer, the undoped buffer layer being lattice-matched to InP.

23. The method of claim 21 wherein the metal anode contact is deposited on the Schottky layer.

* * * * *

UNITED STATES PATENT AND TRADEMARK OFFICE
CERTIFICATE OF CORRECTION

PATENT NO.    : 6,316,342 B1                                             Page 1 of 1
DATED         : November 13, 2001
INVENTOR(S)   : Schmitz et al.

It is certified that error appears in the above-identified patent and that said Letters Patent is hereby corrected as shown below:

<u>Column 1,</u>
Lines 8 - 9, cancel "awarded by the Defense Advanced Research Projects Agency (DARPA)"

Signed and Sealed this

Second Day of July, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,316,342 B1 Page 1 of 1
DATED : November 13, 2001
INVENTOR(S) : Adele E. Schmitz et al.

It is certified that error appears in the above-identified patent and that said Letters Patent is hereby corrected as shown below:

Column 4,
Line 28, change "AlIAs" to -- AlInAs --.

Column 5,
Line 49, change "AlnIAs" to -- AlInAs --.

Column 6,
Line 41, change "AlnIAs" to -- AlInAs --.

Column 8,
Lines 11 and 13, change "AlnIAs" to -- AlInAs --.

Signed and Sealed this

Twenty-eighth Day of December, 2004

JON W. DUDAS
*Director of the United States Patent and Trademark Office*